(12) United States Patent
Yamamoto et al.

(10) Patent No.: US 10,050,224 B2
(45) Date of Patent: Aug. 14, 2018

(54) OPTICAL-DEVICE SURFACE-SEALING COMPOSITION, OPTICAL-DEVICE SURFACE-SEALING SHEET, DISPLAY, AND DISPLAY MANUFACTURING METHOD

(71) Applicant: MITSUI CHEMICALS, INC., Minato-ku, Tokyo (JP)

(72) Inventors: Yugo Yamamoto, Chiba (JP); Setsuko Oike, Yokohama (JP); Masatoshi Takagi, Yokohama (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 0 days.

(21) Appl. No.: 15/446,887

(22) Filed: Mar. 1, 2017

(65) Prior Publication Data

US 2017/0179426 A1   Jun. 22, 2017

Related U.S. Application Data

(62) Division of application No. 14/379,443, filed as application No. PCT/JP2013/001001 on Feb. 21, 2013.

(30) Foreign Application Priority Data

Feb. 24, 2012 (JP) ................. 2012-038838

(51) Int. Cl.
| | |
|---|---|
| C08L 63/00 | (2006.01) |
| H01L 51/52 | (2006.01) |
| H01L 27/32 | (2006.01) |
| C09J 163/00 | (2006.01) |
| H01L 51/56 | (2006.01) |
| B32B 15/08 | (2006.01) |
| B32B 15/20 | (2006.01) |
| B32B 27/30 | (2006.01) |
| B32B 27/32 | (2006.01) |
| B32B 27/36 | (2006.01) |
| B32B 27/40 | (2006.01) |
| C08G 59/24 | (2006.01) |
| C08G 59/50 | (2006.01) |
| C08G 59/56 | (2006.01) |
| H01L 51/00 | (2006.01) |

(52) U.S. Cl.
CPC .......... *H01L 51/5246* (2013.01); *B32B 15/08* (2013.01); *B32B 15/20* (2013.01); *B32B 27/302* (2013.01); *B32B 27/308* (2013.01); *B32B 27/32* (2013.01); *B32B 27/325* (2013.01); *B32B 27/36* (2013.01); *B32B 27/365* (2013.01); *B32B 27/40* (2013.01); *C08G 59/245* (2013.01); *C08G 59/5073* (2013.01); *C08G 59/56* (2013.01); *C09J 163/00* (2013.01); *H01L 27/32* (2013.01); *H01L 51/0035* (2013.01); *H01L 51/56* (2013.01); *B32B 2255/06* (2013.01); *B32B 2274/00* (2013.01); *B32B 2307/412* (2013.01); *B32B 2307/51* (2013.01); *B32B 2457/20* (2013.01); *C08L 63/00* (2013.01); *C08L 2205/03* (2013.01)

(58) Field of Classification Search
None
See application file for complete search history.

(56) References Cited

U.S. PATENT DOCUMENTS

| | | |
|---|---|---|
| 2004/0155364 A1 | 8/2004 | Doba |
| 2009/0134426 A1 | 5/2009 | Katayama et al. |
| 2011/0001419 A1 | 1/2011 | Takamatsu |
| 2011/0186893 A1 | 8/2011 | Kondo |
| 2011/0201763 A1 | 8/2011 | Noro et al. |
| 2012/0180866 A1 | 7/2012 | Matsushima |

FOREIGN PATENT DOCUMENTS

| | | |
|---|---|---|
| CN | 102190776 A | 9/2011 |
| CN | 101445605 A | 12/2012 |
| JP | 2003-317937 A | 11/2003 |
| JP | 2005-213470 A | 8/2005 |
| JP | 2005-298703 A | 10/2005 |
| JP | 2005-306946 A | 11/2005 |
| JP | 2006-070221 A | 3/2006 |
| JP | 2009-081123 A | 4/2009 |
| JP | 2009-127021 A | 6/2009 |
| JP | 2009-199979 A | 9/2009 |
| JP | 2010-226046 A | 10/2010 |

(Continued)

OTHER PUBLICATIONS

International Search Report (PCT/ISA/210) dated Jun. 4, 2013, by the Japanese Patent Office as the International Searching Authority for International Application No. PCT/JP2013/001001.

(Continued)

*Primary Examiner* — Ana L Woodward

(74) *Attorney, Agent, or Firm* — Buchanan, Ingersoll & Rooney PC

(57) ABSTRACT

The purpose of the present invention is to provide the following: an optical-device surface-sealing composition that makes it possible to fabricate an optical-device-using display with a low amount of warpage even if there is a large difference between the coefficients of linear expansion of substrates used in said display; a display with a low amount of warpage; and a manufacturing method therefor. The storage modulus of elasticity ($G'(80)$) of this optical-device surface-sealing composition, measured at 80° C. after said composition is heated from 40° C. to 80° C. at 5° C./min and then held at 80° C. for 30 minutes, is between $1.0 \times 10^3$ and $2.0 \times 10^6$ Pa.

5 Claims, 2 Drawing Sheets

(56) References Cited

FOREIGN PATENT DOCUMENTS

| JP | 2010-251117 A | 11/2010 |
| JP | 2011-168701 A | 9/2011 |
| JP | 2011-258845 A | 12/2011 |
| WO | WO 2009/093467 A1 | 7/2009 |
| WO | WO 2011/040281 A1 | 4/2011 |

OTHER PUBLICATIONS

Abstract, CN 101440270 A, May 27, 2009, Zhangjiagang Xiyi Novel Automo, one page.
Derwent accession No. 2009-K09827 for CN 101440270 A, May 27, 2009, Zhangjiagang Xiyi New Automobile Parts, Co. Ltd., two pages.
HCAPLUS accession No. 2009-656635 for CN 101440270 A, May 27, 2009, Zhangjigang Soeil New Automobile Fittings Co., Ltd., one page.

US 10,050,224 B2

OPTICAL-DEVICE SURFACE-SEALING COMPOSITION, OPTICAL-DEVICE SURFACE-SEALING SHEET, DISPLAY, AND DISPLAY MANUFACTURING METHOD

CROSS-REFERENCE TO RELATED APPLICATIONS

This application is a divisional of U.S. application Ser. No. 14/379,443, filed Aug. 18, 2014, which is a U.S. National Stage Application of PCT/JP2013/001001, filed Feb. 21, 2013, which claims priority to Japanese Patent Application No. 2012-038838, filed Feb. 24, 2012, the contents of all of which are hereby incorporated by reference.

TECHNICAL FIELD

The present invention relates to an optical device surface-sealing composition, an optical device surface-sealing sheet, a display, and a method of manufacturing a display.

BACKGROUND ART

Displays having optical devices, particularly organic EL displays having organic EL devices have been expected as flat panel displays because of their advantages such as wide view angle, fast response speed, and low power consumption. Each organic EL device that constitutes an organic EL display includes two electrodes (one of which is transparent) and an organic light-emitting medium layer disposed between the electrodes. Current is injected from both of the electrodes so that the organic light-emitting medium layer emits light.

Since optical devices, particularly the organic light-emitting medium layer of the organic EL devices, are degraded by moisture or the like, a method for surface-sealing an organic EL device has been investigated to prevent the moisture or the like from coming in contact with the organic EL device (PTL 1). In other words, an organic EL display has been investigated that includes a pair of substrates and a surface-sealing material disposed between the substrates for surface-sealing the organic EL device. A member for surface-sealing an organic EL device (surface-sealing material) may be in general a cured product of a composition including a thermosetting resin such as epoxy resin curable under conditions which hardly cause deterioration of an organic EL device.

The total thickness of an organic EL device (total thickness of the two electrodes and the organic light-emitting medium layer disposed between the electrodes) is particularly small: about several hundred nanometers thick. As a result, the thickness of an organic EL display is determined substantially by the sum of the thickness of the substrates and the thickness of the surface-sealing material for surface-sealing an organic EL device. An organic EL device is expected for use in a compact and thin display or a backlight member for a cell-phone or the like which is expected to be thinner or more lightweight, and a flexible display or the like having a substrate of flexible plastic.

A problem of a thin substrate for a thin display, however, is that warpage occurs in the display due to, for example, the heat imparted when surface-sealing an optical device, particularly an organic EL device. In order to prevent the warpage of a display, it has been proposed in the art to dispose a warpage prevention layer or an anti-curl layer on the substrate of the display with an adhesive layer interposed in between (refer to PTLs 2 and 3).

CITATION LIST

Patent Literature

PTL 1
Japanese Patent Application Laid-Open No. 2006-070221
PTL 2
Japanese Patent Application Laid-Open No. 2003-317937
PTL 3
Japanese Patent Application Laid-Open No. 2009-81123

SUMMARY OF INVENTION

Technical Problem

A display including optical devices, particularly an organic EL display, includes a pair of substrates (e.g. a circuit substrate and a display substrate) and a surface-sealing material disposed between the substrates for surface-sealing the organic EL devices. The difference in linear expansion coefficient between the circuit substrate and the display substrate may be large in some cases. When manufacturing such a display, the difference caused in expansion and contraction between the substrates, for example, during heat curing of a surface-sealing composition has in some cases caused warpage or strain in the resultant display.

An object of the present invention is to provide an optical device surface-sealing composition for manufacturing an organic EL display having less warpage even with a large difference in linear expansion coefficient between a pair of substrates (e.g. a circuit substrate and a display substrate) for constituting a display using an optical device, a display having little warpage, and a manufacturing method thereof.

Solution to Problem

A first aspect of the present invention relates to optical device surface-sealing compositions given below.

[1] An optical device surface-sealing composition having a storage elastic modulus G' (80) of $1.0 \times 10^3$ to $2.0 \times 10^6$ Pa at 80° C. measured after temperature increase from 40° C. to 80° C. at 5° C./min and subsequent temperature retention at 80° C. for 30 minutes.

[2] The optical device surface-sealing composition according to [1], including a flexible epoxy resin (A) having two or more epoxy groups in a molecule, and a curing accelerator (B).

[3] The optical device surface-sealing composition according to [2], wherein the component (A) is at least one resin selected from the group consisting of an aliphatic epoxy resin, a thiol epoxy resin, a butadiene epoxy resin, a polyol-modified epoxy resin, an ε-caprolactone-modified epoxy resin, a rubber-modified epoxy resin, a dimer acid-modified epoxy resin, a urethane modified epoxy resin, and an amine-modified epoxy resin.

[4] The optical device surface-sealing composition according to [2] or [3], wherein the component (A) is an epoxy resin having a hard segment including a fluorene structure or a bisphenol structure and a soft segment including a structure derived from a compound selected from the group consisting of $C_{2-20}$ alkylene glycol, polybutadiene, and a butadiene-acrylic copolymer or a $C_{2-20}$ alkylene group.

[5] The optical device surface-sealing composition according to any one of [2] to [4], wherein 10 to 70 parts by weight of the component (A) is contained in 100 parts by weight of the entire composition.

[6] The optical device surface-sealing composition according to [1], including a thermoplastic elastomer.

[7] The optical device surface-sealing composition according to any one of [1] to [6], wherein the composition is used for surface-sealing an organic EL device.

[8] An optical device surface-sealing sheet including a layer formed of the composition according to any one of [1] to [6].

[9] The optical device surface-sealing sheet according to [8], wherein the composition is used for surface-sealing an organic EL device.

A second aspect of the present invention relates to displays and methods of manufacturing a display given below.

[10] A display including, in order:
a substrate (H);
a surface-sealing material having a storage elastic modulus G' (80) of $1.0 \times 10^3$ to $2.0 \times 10^6$ Pa at 80° C.; and
a substrate (L),
wherein an optical device is disposed on the substrate (H) or on the substrate (L), wherein
a linear expansion coefficient of the substrate (L) is smaller than a linear expansion coefficient of the substrate (H), and a difference between the linear expansion coefficient of the substrate (H) and the linear expansion coefficient of the substrate (L) is $5 \times 10^{-6}$ cm/cm/° C. or more.

[11] The display according to [10], wherein the linear expansion coefficient of the substrate (H) is $20 \times 10^{-6}$ to $200 \times 10^{-6}$ cm/cm/° C.

[12] The display according to [10] or [11], wherein the substrate (H) is a metal plate containing aluminum or a resin plate containing one or more selected from the group consisting of an ester (co)polymer, a cyclic olefin (co)polymer, a 4-methyl-1-pentene (co)polymer, an acrylic (co)polymer, and polycarbonate.

[13] The display according to any one of [10] to [12], wherein the linear expansion coefficient of the substrate (L) is $1 \times 10^{-6}$ to $100 \times 10^{-6}$ cm/cm/° C.

[14] The display according to any one of [10] to [13], wherein the substrate (L) is an inorganic substrate containing glass or silicon, or a resin plate containing one or more selected from the group consisting of an ester (co)polymer, polyimide, polycarbonate, and polyamide.

[15] The display according to any one of [10] to [14], wherein the optical device is an organic EL device.

[16] A method of manufacturing a display including: obtaining a laminate having, in order, a first substrate on which an optical device is disposed, a layer formed of the optical device surface-sealing composition according to any one of [1] to [7] laminated on the optical device, and a second substrate; and heating the laminate at 50 to 110° C.

[17] The method according to [16], wherein a linear expansion coefficient of the second substrate is smaller than a linear expansion coefficient of the first substrate, and a difference between the linear expansion coefficient of the one substrate and the linear expansion coefficient of the other substrate is $5 \times 10^{-6}$ cm/cm/° C. or more.

[18] The manufacturing according to [16] or [17], wherein the optical device is an organic EL device.

Advantageous Effects of Invention

The optical device surface-sealing composition of the present invention can limit, even in the case of a display including an optical device (e.g. an organic EL display including an organic EL device) having a pair of substrates (e.g. a display substrate and a circuit substrate) of which the difference in linear expansion coefficient is equal to or above a certain value, the occurrence of warpage of the display when sealing an optical device such as an organic EL device by heating the composition.

DESCRIPTION OF EMBODIMENTS

1. Optical Device Surface-Sealing Composition

Figure 1:
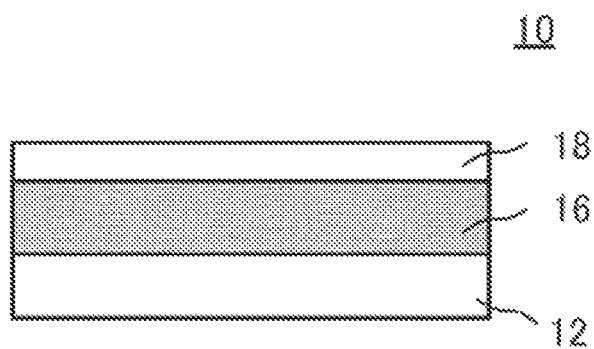
FIG. 1 is a cross-sectional diagram illustrating an optical device surface-sealing composition according to an embodiment of the present invention.

The optical device surface-sealing composition of the present invention may be preferably a composition for surface-sealing an organic EL device (organic EL device surface-sealing composition). The optical device surface-sealing composition of the present invention has a storage elastic modulus G' (80) of $1.0 \times 10^3$ to $2.0 \times 10^6$ Pa at 80° C. measured after temperature increase of the composition from 40° C. to 80° C. at 5° C./min and subsequent temperature retention at 80° C. for 30 minutes.

In Embodiment 1 of the present invention, the optical device surface-sealing composition may contain a flexible epoxy resin (A) and a curing accelerator (B) on an as-needed basis. The optical device surface-sealing composition which contains the components may further contain a high molecular weight epoxy resin (C), a low molecular weight epoxy resin (D), a silane coupling agent having an epoxy group or a functional group capable of reacting with an epoxy group (E), a solvent (F), and other component(s) (G).

In Embodiment 2 of the present invention, the optical device surface-sealing composition may contain a thermoplastic elastomer on an as-needed basis. The optical device surface-sealing composition according to Embodiment 2 which contains a thermoplastic elastomer may contain no component other than the thermoplastic elastomer, or may further contain any one or all of the components (A) to (G) on an as-needed basis.

The shape of the optical device surface-sealing composition of the present invention is not limited and may be in liquid form or sheet form. The sheet-like optical device surface-sealing composition of the present invention may be a laminate. The laminate may be formed of a layer including the components (A) and (B) and a layer not including the components (A) and (B). The composition which contains a thermoplastic elastomer may be a laminate formed of a layer of thermoplastic elastomer and a layer which is disposed on one or both sides of the layer and contains an epoxy resin and no thermoplastic elastomer.

The optical device surface-sealing composition of the present invention has a storage elastic modulus G' (80) of $1.0 \times 10^3$ to $2.0 \times 10^6$ Pa at 80° C. measured after temperature increase from 40° C. to 80° C. at 5° C./min and subsequent temperature retention at 80° C. for 30 minutes. In the case that a display is manufactured using a pair of substrates (e.g. a circuit substrate and a display substrate) having a difference equal to or above a certain value in linear expansion coefficient and an optical device surface-sealing composition having a storage elastic modulus G' (80) that is larger than the upper limit of the above-described range, the stress caused by the difference in the expansion or contraction between the two substrates cannot be relaxed with the cured product or the thermocompressed material of the composition. Consequently, the display is likely to be significantly warped. In contrast, an optical device surface-sealing composition having a storage elastic modulus G' (80) of smaller than the lower limit of the above-described range has excessively high flowability. Consequently, the handling ability in surface-sealing an optical device such as an organic EL device is likely to be reduced. Furthermore, the sealing performance of the surface-sealing material is reduced, with difficulty in preventing infiltration by moisture or the like causing possible degradation of an optical device such as an organic EL device, in particular, resulting in possible reduction in reliability of the display. In the case of an optical device surface-sealing composition having thermosetting properties (e.g. an optical device surface-sealing composition according to Embodiment 1), the surface-sealing material means a cured product of the composition. In the case of the composition having no thermosetting properties (e.g. an optical device surface-sealing composition according to Embodiment 2), the surface-sealing material means the composition itself.

In the case of the optical device surface-sealing composition of the present invention with thermosetting properties including the component (A) and the like to be described later (e.g. an optical device surface-sealing composition according to Embodiment 1), the composition is heated from 40° C. to 80° C. at 5° C./min and maintained at 80° C. for 30 minutes for heat curing to form into a cured product. In other words, the phrase "the optical device surface-sealing composition of the present invention has a storage elastic modulus G' (80) of $1.0 \times 10^3$ to $2.0 \times 10^6$ at 80° C. measured after temperature increase from 40° C. to 80° C. at 5° C./min and subsequent temperature retention at 80° C. for 30 minutes" means that, in the case of the composition of the present invention being a thermosetting composition, a cured product which is obtained by heating the composition from 40° C. to 80° C. at 5° C./min and then maintained at 80° C. for 30 minutes has a storage elastic modulus of $1.0 \times 10^3$ to $2.0 \times 10^6$ Pa measured at 80° C.

On the other hand, in the case of the optical device surface-sealing composition of the present invention which contains a thermoplastic elastomer to be described later and no thermosetting properties (e.g. an optical device surface-sealing composition according to Embodiment 2), the composition heated from 40° C. to 80° C. at 5° C./min and then maintained at 80° C. for 30 minutes results in no heat curing. It means that the composition itself containing the thermoplastic elastomer to be described later has a storage elastic modulus of $1.0 \times 10^3$ to $2.0 \times 10^6$ Pa measured at 80° C.

Examples of a method for obtaining a storage elastic modulus G' (80) that falls within the above-described range at 80° C. include adjusting the type and the content (relative to all the components of a composition) of the flexible epoxy resin (A) in an optical device surface-sealing composition according to Embodiment 1. The increase in the ratio of the component (A) allows the storage elastic modulus G' (80) to be reduced.

In an optical device surface-sealing composition according to Embodiment 2, the storage elastic modulus G' (80) of the composition of the present invention may be adjusted by selecting the type of thermoplastic elastomer.

Optical Device Surface-Sealing Composition According to Embodiment 1

The optical device surface-sealing composition according to Embodiment 1 may contain a flexible epoxy resin (A) and a curing accelerator (B).

(A) Flexible Epoxy Resin

The optical device surface-sealing composition of the present invention may contain a flexible epoxy resin for adjustment of the storage elastic modulus G' (80). The flexible epoxy resin is an epoxy resin having both rubber elasticity and strength. The flexible epoxy resin is preferably an epoxy resin having two or more epoxy groups in a molecule, more preferably a two-functional epoxy resin having two epoxy groups in a molecule. From the viewpoint of manufacturing a display with little warpage, the flexible epoxy resin is also preferably one that exhibits flexibility in the temperature range within which the optical device surface-sealing composition (also referred to as an organic EL device surface-sealing composition when manufacturing an organic EL display) is heated during the manufacturing process of a display to be described later.

A flexible epoxy resin may be specifically defined as follows.

1) A varnish of a flexible epoxy resin composition is prepared by mixing 70 parts by weight of a flexible epoxy resin, 30 parts by weight of acid anhydride (e.g. RIKACID MH700G (main component: methylhexahydrophthalic anhydride, made by New Japan Chemical Co., Ltd.)), 1 part by weight of a curing accelerator (e.g. IBMI12 (1-isobutyl-2-methylimidazole, made by Mitsubishi Chemical Corporation)), and 1 part by weight of a curing accelerator (e.g. 2E4MZ (1-cyanoethyl-2-ethyl-4-methylimidazole, made by Shikoku Chemicals Corporation)).

2) Meanwhile, a laminate of a glass plate/a mold-releasing film/a spacer (500-μm thick)/a mold-releasing film/a glass plate spacer is made. The center part of the laminate is hollowed out so as to form a 1.5 cm by 1.5 cm square recess to fabricate an instrument for curing.

3) The recess of the instrument is filled with the varnish and the thickness is adjusted to 500 μm by the own weight of the glass plate. The varnish is heated for curing at 80° C. for 1 hour to 3 hours until stickiness to the mold-releasing films disappears.

4) The produced cured product of the flexible epoxy resin composition is measured by the method described in "(3) storage elastic modulus method" to be described later. An epoxy resin having a storage elastic modulus G'E (80) in the range of $1.0 \times 10^3$ to $2.0 \times 10^6$ Pa measured at 80° C. by the method can be used as a "flexible epoxy resin."

The flexible epoxy resin of the present invention may be: α) an epoxy resin such as an aliphatic epoxy resin, a butadiene epoxy resin, and a thiol epoxy resin; or β) a modified epoxy resin such as a polyol-modified epoxy resin, an ε-caprolactone-modified epoxy resin, a rubber-modified epoxy resin, a dimer acid-modified epoxy resin, a urethane-modified epoxy resin, and an amine-modified epoxy resin.

α) Epoxy Resin

The aliphatic epoxy resin is not specifically limited, and examples include a two-functional epoxy resin which is commonly manufactured and sold such as a diglycidyl ether including 1,6-hexanediol diglycidyl ether, trimethylolpropane triglycidyl ether, polypropylene glycol diglycidyl ether, and neopentyl glycol diglycidyl ether. Examples of the thiol epoxy resin include a dithioether-modified epoxy resin. Examples of the butadiene epoxy resin include polybutadiene-modified epoxy resin.

β) Modified Epoxy Resin

Preferably the modified epoxy resin is either a modified epoxy resin produced from the reaction of bisphenol or bisphenoifluorene with epichlorohydrin, or an epoxy resin produced from the reaction of a modified bisphenol or bisphenoifluorene with epichlorohydrin.

Examples of the polyol-modified epoxy resin include bisphenol A bis(triethylene glycol glycidyl ether)ether and bisphenol A bis(propylene glycol glycidyl ether)ether.

The hard segment is a segment which includes a fluorene structure or a bisphenol structure. The soft segment is a segment which is present between two hard segments or between a hard segment and an epoxy group in one molecule of the flexible epoxy resin.

For example, in an epoxy resin represented by the following formula, the hard segment may be a bisphenol structure ($-C_6H_4-C(CH_3)_2-C_6H_4-$), and the soft segment may be ($-OCH_2CH(CH_3)-O-)_{nd1}$ or ($-OCH_2CH(CH_3)-O-)_{nd2}$ sandwiched between a hard segment and an epoxy group (where $n_{d1}$ and $n_{d2}$ each independently represent an integer of 1 to 6).

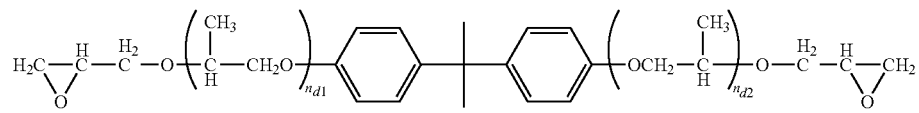

Examples of the ε-caprolactone-modified epoxy resin include an ε-caprolactone modified two functional epoxy resin such as an ε-caprolactone modified bisphenol A epoxy resin and ε-caprolactone modified (3,4-3',4'-epoxycyclohexyl)methylhexane carboxylate.

Examples of the rubber-modified epoxy resin include a modified product obtained by carboxylation of a diglycidyl etherified product of bisphenol A by epichlorohydrin with a butadiene-acrylonitrile copolymer. Examples of the rubber-modified epoxy resin commercially available include EPDX-MK SR35K and EPDX-MK SR3542.

Examples of the dimer acid-modified epoxy resin include YD-171 and YD-172 made by Nippon Steel & Sumikin Chemical Co., Ltd.

Examples of the urethane-modified epoxy resin include a urethane cross-linked bisphenol epoxy resin having a structure for cross-linking two or more molecules of bisphenol epoxy resin (e.g. a bisphenol A epoxy resin, a bisphenol F epoxy resin, and a bisphenol AD epoxy resin) with a urethane polymer. Examples of the urethane-modified epoxy resin commercially available include EPU-78-13S (urethane cross-linked bisphenol epoxy resin) made by Adeka Corporation.

Among the foregoing, a polyol-modified epoxy resin and an aliphatic epoxy resin are preferred in view of the rubber elasticity and strength. The flexible epoxy resins may be used singly or in combination.

In order to obtain a cured product having sufficient moisture permeability and transparency with a storage elastic modulus in the required range, the flexible epoxy resin preferably has a hard segment including a fluorene structure or a bisphenol structure and a soft segment including a structure derived from a compound selected from the group consisting of a $C_{2-20}$ (preferably $C_{2-5}$) alkylene glycol, polybutadiene, and a butadiene-acrylic copolymer, or a $C_{2-20}$ (preferably $C_{2-5}$) alkylene group.

Examples of the $C_{2-20}$ alkylene glycol include ethylene glycol, propylene glycol, HO—$(CH_2CH_2-O)_m$—H (where m represents an integer of 1 to 10) which includes an ethylene glycol unit as a repeating unit, and HO—$(CH_2CH(CH_3)-O)_n$—H (where n represents an integer of 1 to 6) which includes a propylene glycol unit as a repeating unit. Examples of the butadiene-acrylic copolymer include an acrylonitrile-butadiene copolymer. Examples of the $C_{2-20}$ alkylene group include a pentylene group.

The content of the flexible epoxy resin (A) is preferably 10 to 70 parts by weight relative to 100 parts by weight of the entire composition, more preferably 20 to 50 parts by weight. When the content falls within the above-described range, it easily limits the warpage of a display made using the composition of the present invention. In the case that a high molecular weight epoxy resin (C) to be described later is added to the composition of the present invention so as to be formed into a sheet form, the sheet shape is easily maintained. In the case that the sheet-like composition is formed on a mold-releasing film, the sheet-like composition is easily separated from the mold-releasing film while maintaining the shape.

(B) Curing Accelerator

Preferably the optical device surface-sealing composition of the present invention which includes the component (A) contains a curing accelerator (B). The curing accelerator has a function of initiating and accelerating curing of an epoxy resin.

Examples of the curing accelerator include imidazole compounds and amine compounds. Examples of the imidazole compounds include 2-ethyl-4-methylimidazole. Examples of the amine compounds include tris-dimethylaminomethylphenol. The curing accelerator (B) may be a Lewis base compound.

The curing accelerator has a molecular weight of, preferably 70 to 800, more preferably 80 to 500, and further more preferably 90 to 250. A curing accelerator (B) having a molecular weight less than 70 results in high volatility, which may cause gas bubbles in the optical device surface-sealing composition during thermal compression of the optical device surface-sealing composition. In contrast, a curing accelerator having a molecular weight more than 800 may reduce flowability of the optical device surface-sealing composition during thermal compression of the optical device surface-sealing composition, and may result in insufficient curability in some cases due to reduction in diffusibility of the curing accelerator in the optical device surface-sealing composition.

In the case that the composition of the present invention contains an epoxy resin, the content of the curing accelerator (B) is preferably 0.01 to 10 parts by mass relative to the total 100 parts by mass of the epoxy resins contained.

(C) High Molecular Weight Epoxy Resin

The high molecular weight epoxy resin (C) of the present invention is an epoxy resin other than the flexible epoxy resin (A), which is added to the composition of the present invention including the component (A) in some cases, so that the composition can be formed into a sheet form.

The component (C) is an epoxy resin having a weight-average molecular weight of $2\times10^3$ to $1\times10^5$, preferably $3\times10^3$ to $8\times10^4$, more preferably $4\times10^3$ to $6\times10^4$. The weight-average molecular weight may be measured under the following conditions by gel permeation chromatography (GPC) with polystyrene as a standard material.

Apparatus: GPC-101 made by SHODEX;
Developing solvent: tetrahydrofuran; and
Standard polystyrene: PS-1 made by Varian Inc. (molecular weight: 580 to 7,500,000), and PS-2 made by Varian Inc. (molecular weight: 580 to 377,400).

The component (C) blended in the composition allows the shape stability to be improved when the composition of the present invention is formed into a sheet form or the like. The epoxy resin having the weight-average molecular weight allows for relatively low temperature dependency of the storage elastic modulus. Consequently, the blending of the high molecular weight epoxy resin (C) having the weight-average molecular weight in a predetermined amount or more produces a composition having small variation in storage elastic module G' with temperature.

Preferably the high molecular weight epoxy resin has an epoxy equivalent of 500 to $1\times10^4$ g/eq in view of the crosslink density of the cured product of the composition and the like, more preferably 600 to 9,000 g/eq.

Preferred examples of the high molecular weight epoxy resin (C) include a resin having a bisphenol skeleton in the main chain because low moisture permeability and the like can be achieved, more preferably a resin which contains bisphenol and epichlorohydrin as monomer components, further more preferably an oligomer thereof.

All of the monomer components of the high molecular weight epoxy resin (C) may be bisphenol and epichlorohydrin. Alternatively, some of the monomer components may be a compound (comonomer component) other than bisphenol and epichlorohydrin. Examples of the comonomer component include a divalent or higher-valent polyalcohol (e.g. divalent phenol and glycol). With some of the monomer components being a compound other than bisphenol (comonomer component) and epichlorohydrin, it is possible to control the molecular weight to a desired value.

Preferred examples of the high molecular weight epoxy resin include a resin having a repeating structural unit represented by the following general formula (1).

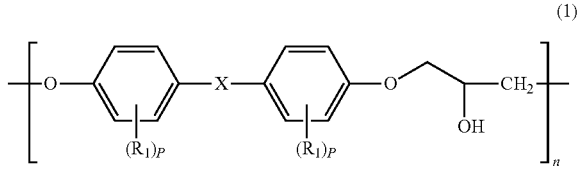

(1)

In the general formula (1), X represents a single bond, a methylene group, an isopropylidene group, —S—, or —SO$_2$—. In the general formula (1), the structural unit whose X is methylene group is a structural unit of bisphenol F type, and the structural unit whose X is isopropylidene group is a structural unit of bisphenol A type. Further, n represents the repeating number of the structural unit represented by the general formula (1), being an integer of 2 or more.

In the general formula (1), P represents the substitution number of a substituent $R_1$, being an integer of 0 to 4. In view of the heat resistance and the low moisture permeability, P is preferably 0. $R_1$ each independently represents a $C_{1-5}$ alkyl group, preferably being a methyl group.

In the present invention, in particular, an oligomer which includes the repeating structural unit of bisphenol F type whose X is methylene group in the general formula (1) and the repeating structural unit of bisphenol A type whose X is isopropylidene group in the general formula (1) in a molecule is preferred. The oligomer which contains the repeating structural unit of bisphenol A type allows the high molecular weight epoxy resin composition to have a high viscosity. On the other hand, the oligomer which contains the repeating structural unit of bisphenol F type allows the steric barrier to be reduced. Consequently a plurality of phenylene groups is easily oriented, so that the moisture permeability of the cured product of the optical device surface-sealing composition can be reduced.

The ratio of the number (F) of repeating structural unit of bisphenol F type in a molecule to the sum of the number (A) of repeating structural unit of bisphenol A type and the number (F) of repeating structural unit of bisphenol F type in a oligomer molecule {(F/A+F)×100} is preferably 50% or more, more preferably 55% or more. Including the large amount of repeating structural units of bisphenol F type allows the cured product of the optical device surface-sealing composition to have sufficiently low moisture permeability.

The content of the high molecular weight epoxy resin (C) is preferably 100 to 2,000 parts by mass, more preferably 210 to 2,000 parts by mass, further more preferably 250 to 1,200 parts by mass relative to the total 100 parts by mass of the curing accelerator (B), the low molecular weight epoxy resin (D) to be described later, the flexible epoxy resin (A), and the silane coupling agent (E) to be described later. The content ratio of the high molecular weight epoxy resin (C) in the above-described range allows the sheet-like composition of the present invention to easily maintain the sheet shape. An excessively high content ratio of the high molecular weight epoxy resin (C) reduces the flowability of the composition when sealing an optical device such as an organic EL device, which may cause a gap between the composition and the optical device such as an organic EL device.

For the optical device surface-sealing composition which contains the low molecular weight epoxy resin (D) to be described later and the flexible epoxy resin (A), the content of the high molecular weight epoxy resin (C) is preferably 50 to 1,200 parts by mass, more preferably 80 to 1,000 parts by mass relative to the total 100 parts by mass of the low molecular weight epoxy resin (D) and the flexible epoxy resin (A). The content ratio of the high molecular weight epoxy resin (C) in the range relative to the total of the low molecular weight epoxy resin (D) and the flexible epoxy resin (A) improves the shape stability of the optical device surface-sealing composition and produces a cured product having low moisture permeability, without reduction in flowability in surface-sealing an organic EL device. In processing into a sheet form, the content ratio of the high molecular weight epoxy resin (C) of 100 to 800 parts by mass relative to the total of the low molecular weight epoxy resin (D) and the flexible epoxy resin (A) allows the sheet shape to be easily maintained.

(D) Low Molecular Weight Epoxy Resin

The optical device surface-sealing composition of the present invention may contain a low molecular weight epoxy resin (D). The low molecular weight epoxy resin is an epoxy resin other than the flexible epoxy resin (A), having a weight-average molecular weight of 100 to 1,200, preferably 200 to 1,100. The weight-average molecular weight is measured in the same way as described above. The blending of the epoxy resin (C) having the weight-average molecular weight in the above-described range in an optical device surface-sealing composition allows the flowability of the optical device surface-sealing composition to be increased when sealing an optical device such as an organic EL device with the optical device surface-sealing composition, resulting in improved adhesion to the optical device such as an organic EL device.

The low molecular weight epoxy resin (D) has an epoxy equivalent of preferably 80 to 300 g/eq, more preferably 100 to 200 g/eq. Blending the low molecular weight epoxy resin having an epoxy equivalent in the above-described range in an optical device surface-sealing composition allows the amount of hydrogen bonds in the optical device surface-sealing composition to be increased, so that the storage elastic modulus at 80° C. in a predetermined range may be obtained.

The low molecular weight epoxy resin (D) is preferably a phenol type epoxy resin, more preferably a divalent or higher-valent phenol type epoxy resin, or an oligomer including a phenol derivative and epichlorohydrin as monomer components.

Examples of the divalent or higher-valent phenol type epoxy resin include a bisphenol epoxy compound, a phenol novolac type epoxy compound, and a cresol novolac type epoxy compound. Examples of the bisphenol epoxy compound include a compound represented by the general formula (2). In the general formula (2), X, $R_1$, and P are the same as X, $R_1$, and P in the general formula (1).

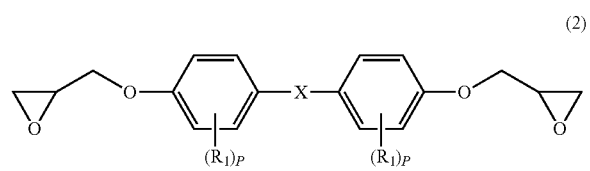

(2)

Examples of the phenol derivative of the oligomer including a phenol derivative and epichlorohydrin as monomer components include bisphenol, hydrogenated bisphenol, phenol novolac, and cresol novolac.

Preferred examples of the low molecular weight epoxy resin (D) include a bisphenol epoxy compound and an oligomer including bisphenol and epichlorohydrin as monomer components, more preferably an oligomer having a repeating number n of 2 to 4 in the general formula (1). Such an oligomer has high compatibility with a high molecular weight epoxy resin.

The repeating structural unit included in the low molecular weight epoxy resin (D) may be the same as or different from the repeating structural unit included in the high molecular weight epoxy resin (C).

The content of the low molecular weight epoxy resin (D) is preferably 1 to 100 parts by mass, more preferably 5 to 50 parts by mass, relative to the total 100 parts by mass of the high molecular weight epoxy resin (C), the curing accelerator (B), and the silane coupling agent (E) to be described later. The content of the low molecular weight epoxy resin (D) in the above-described range allows the optical device surface-sealing composition to have sufficient flowability during sealing an optical device such as an organic EL device with the composition, and enhances the thermosetting properties in the case of an optical device surface-sealing composition having thermosetting properties.

(E) Silane Coupling Agent Having Epoxy Group or Functional Group Capable of Reacting with Epoxy Group The optical device surface-sealing composition of the present invention may contain a silane coupling agent having an epoxy group 1), and a silane coupling agent having a functional group 2) capable of reacting with an epoxy group. The reaction with an epoxy group includes an addition reaction with the epoxy group. In the case that an optical device surface-sealing composition which contains a silane coupling agent is used, for example, as an optical device surface-sealing sheet for an organic EL, the adhesion to a substrate is enhanced. In the case that an epoxy resin is present in an optical device surface-sealing composition, the silane coupling agent having an epoxy group or a functional group capable of reacting with an epoxy group reacts with the resin. As a result, the silane coupling agent conveniently allows no low molecular weight component to remain in the cured product of the optical device surface-sealing composition.

The silane coupling agent having an epoxy group 1) is a silane coupling agent including an epoxy group such as a glycidyl group, and examples include γ-glycidoxypropyltrimethoxysilane and β-(3,4-epoxycyclohexyl)ethyltrimethoxysilane.

Examples of the functional group 2) capable of reacting with an epoxy group include an amino group such as a primary amino group and a secondary amino group, a carboxyl group, and a group to be converted into a functional group capable of reacting with an epoxy group (e.g. methacryloyl group and isocyanate group). Examples of the silane coupling agent having a functional group capable of reacting with an epoxy group include N-2-(aminoethyl)-3-aminopropylmethyldimethoxysilane, N-2-(aminoethyl)-3-aminopropylmethyltrimethoxysilane, N-2-(aminoethyl)-3-aminopropylmethyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane or 3-(4-methylpiperazino)propyltrimethoxysilane, trimethoxysilyl benzoate, γ-methacryloxypropyltrimethoxysilane, and γ-isocyanato propyltriethoxysilane.

In combination with the silane coupling agent, an other silane coupling agent may be used. Examples of the other silane coupling agent include vinyltriacetoxysilane and vinyltrimethoxysilane. Such silane coupling agents may be used singly or in combination.

Preferably the silane coupling agent has a molecular weight of 80 to 800. A silane coupling agent having a molecular weight more than 800 may cause reduction in adhesion in some cases due to insufficient flowability when sealing an optical device such as an organic EL device with the optical device surface-sealing composition.

The content of the silane coupling agent is preferably 0.0001 to 30 parts by mass, more preferably 0.0005 to 20 parts by mass, furthermore preferably 0.0008 to 10 parts by mass, relative to 100 parts by mass of the optical device surface-sealing composition.

(F) Solvent

The optical device surface-sealing composition of the present invention may contain a solvent from the perspective of homogenous mixing of the components (A) to (E) and the like. The solvent has a function for uniformly dispersing or dissolving a high molecular weight epoxy resin, in particular. Examples of the solvent may include various kinds of organic solvents including an aromatic solvent such as toluene and xylene; a ketone-based solvent such as acetone, methyl ethyl ketone, and methyl isobutyl ketone; ethers such as ether, dibutyl ether, tetrahydrofuran, dioxane, ethylene glycol monoalkyl ether, ethylene glycol dialkyl ether, and propylene glycol dialkyl ether; an aprotic polar solvent such as N-methylpyrrolidone, dimethyl imidazolidinone, and dimethylformamide; and esters such as ethyl acetate and butyl acetate. The ketone-based solvent (solvent having a keto group) such as methyl ethyl ketone is more preferred particularly due to the easy dissolution of a high molecular weight epoxy resin.

(G) Other Optional Components

The optical device surface-sealing composition of the present invention may further contain optional components such as other resin components, fillers, modifiers, and stabilizers in amounts that do not impair the effect of the invention. Examples of other resin components include polyamide, polyamideimide, polyurethane, polybutadiene, polychloroprene, polyether, polyester, styrene-butadiene-styrene block copolymer, petroleum resin, xylene resin, ketone resin, cellulose resin, fluorine-based oligomer, silicone-based oligomer, and polysulfide-based oligomer. One of these may be contained alone or a plurality of these may be contained in combination.

Examples of the fillers include glass beads, styrene-based polymer particles, methacrylate-based polymer particles, ethylene-based polymer particles, and propylene-based polymer particles. A plurality of the fillers may be used in combination.

Examples of the modifier include a polymerization initiating aid, an antiaging agent, a leveling agent, a wettability improver, a surfactant, and a plasticizer. A plurality of these may be used in combination. Examples of the stabilizer include an ultraviolet absorber, a preserving agent, and an antimicrobial agent. A plurality of modifiers may be used in combination.

The optical device surface-sealing composition of the present invention has a water content of preferably 0.1% or less, more preferably 0.06% or less, in view of prevention of the effect of moisture on a material to be sealed.

An Optical Device Surface-Sealing Composition According to Embodiment 2

Examples of the thermoplastic elastomer which may be contained in an optical device surface-sealing composition according to Embodiment 2 of the present invention include a polystyrene-based elastomer, a polyolefin-based elastomer, a polyurethane-based elastomer, and a polyester-based elastomer. Among them, a polystyrene-based elastomer and a polyolefin-based elastomer are preferred in view of the easy adjustment of adhesion and flexibility.

Examples of the polystyrene-based elastomer include a styrene-isoprene-styrene block copolymer (SIS), a styrene-ethylene/butylene-styrene block copolymer (SEBS), a styrene-ethylene/propylene-styrene block copolymer (SEPS), and an other styrene-diene-based block copolymer and a hydrogenated product thereof (e.g. hydrogenated styrene-butadiene rubber (HSBR)). Examples of the styrene-based elastomer include DYNARON (registered trade mark) made by JSR Corporation.

Examples of the polyolefin-based elastomer include a block copolymer composed of polyolefin blocks which exhibit crystalline characteristics and monomer copolymer blocks which exhibit non-crystalline characteristics. Specific examples thereof include an olefin-ethylene-butylene-olefin copolymer, a polypropylene-polyethylene oxide-polypropylene block copolymer, and a polypropylene-polyolefin-polypropylene block copolymer. Examples of the commercially available polyolefin-based elastomer include NOTIO (registered trade mark) made by Mitsui Chemicals, Inc.

The content of the thermoplastic elastomer in the optical device surface-sealing composition according to Embodiment 2 is preferably 10 mass % or more, more preferably 30 mass % or more, relative to the entire composition.

Curability of Optical Device Surface-Sealing Composition

In the case of an optical device surface-sealing composition of the present invention having thermosetting properties (e.g. an optical device surface-sealing composition according to Embodiment 1), the curing rate of the optical device surface-sealing composition is preferably high to some extent, for increasing the workability in bonding to a material to be thermocompressed. Curing in a rapid manner means, for example, curing within 120 minutes under heating conditions (80 to 100° C.).

Whether or not the optical device surface-sealing composition has been cured may be determined by confirming, with a finger, whether or not the optical device surface-sealing composition thermally cured on a hot plate has been gelated. Alternatively, whether or not the optical device surface-sealing composition has been cured may be determined from the conversion ratio of epoxy groups. The conversion ratio of epoxy groups may be obtained from the reduction rate of epoxy groups in the measurement of IR spectra before and after the curing reaction of the optical device surface-sealing composition. The curability of the optical device surface-sealing composition is controlled by adjustment of the content of a curing accelerator.

Method of Producing Optical Device Surface-Sealing Composition

The optical device surface-sealing composition of the present invention may be manufactured by any method as long as the effect of the present invention is not impaired. For example, the manufacturing method of a sheet formed of the optical device surface-sealing composition according to Embodiment 1 may include: step 1) of preparing components (A) to (E); step 2) of dissolving the components (A) to (E) in component (F) and mixing at 30° C. or lower; step 3) of applying the mixture on a substrate into a sheet form; and step 4) of drying the applied mixture in the sheet form.

In step 2), the components (A) to (E) may be mixed at a time, or the component (A) may be dissolved in the component (F) and mixed and then the other components may be added and mixed. Examples of the mixing method include stirring the components placed in a flask, and kneading using a triple roll mill.

The mixture obtained in step 2) has a viscosity at 25° C. of preferably 0.01 to 100 Pa·s. The viscosity of the mixture in the above-described range allows for improved coating properties and easy forming into a sheet. The viscosity is a measured value at 25° C. by an E-type viscometer (RC-500 made by Toki Sangyo Co., Ltd.). The viscosity of the mixture may be adjusted for example by the amount of the component (E).

The application method in step 3) is not specifically limited, and examples include screen printing, dispensing, and a method using various types of coating rolls. The type of substrate film for use is not specifically limited, and examples include a known mold-releasing film. The coating thickness of the mixture is properly selected depending on the film thickness of the intended optical device surface-sealing composition, and may be set such that the optical device surface-sealing composition has a film thickness of, for example, 1 to 100 μm after drying.

The drying temperature and the drying time in step 4) may be set such that the solvent (F) is removed by drying to a desired level or less without curing of the high molecular weight epoxy resin (C) and the low molecular weight epoxy resin (D) contained in the optical device surface-sealing composition. The drying temperature is, for example, 20 to 70° C., and the drying time is, for example, about 10 minutes to about 3 hours. More specifically, it is preferred that the coating film be dried at 30 to 60° C. under inert gas atmosphere such as nitrogen atmosphere for about 10 minutes and then further dried by vacuum for about 2 hours. The additional vacuum drying allows the solvent and moisture included in the sheet to be removed at a relatively low drying temperature. The drying method is not specifically limited, and examples include hot-air drying and vacuum drying.

The sheet formed of the optical device surface-sealing composition according to Embodiment 2 of the present invention may be obtained from a composition which contains a predetermined thermoplastic elastomer by a commonly used method (e.g. melt extrusion method).

2. Sealing Sheet

The sheet which includes the optical device surface-sealing composition of the present invention is referred to as a sealing sheet. The sealing sheet of the present invention includes a substrate film, a layer formed of the optical device surface-sealing composition formed on the substrate film, and an optional protective film formed on the layer formed of the optical device surface-sealing composition. In a preferred embodiment, a thermosetting resin layer of epoxy resin or the like is further disposed on the surface of the layer formed of optical device surface-sealing composition of the present invention so as to improve the adhesion force between a substrate (H) and a substrate (L) to be described later. In other words, in a preferred embodiment, a thermosetting resin layer/a layer formed of the optical device surface-sealing composition of the present invention/a thermosetting resin layer may be disposed between the substrate film and the protective film.

The layer formed of the optical device surface-sealing composition of the present invention has a water content of preferably 0.1% or less, more preferably 0.06% or less, in view of limiting the effect of the moisture on the material to be sealed. In particular, an optical device such as an organic EL device is easily deteriorated by the moisture. In the case that an optical device such as an organic EL device is sealed with the composition of the present invention, it is therefore preferred that the water content be reduced as much as possible. The water content of the optical device surface-sealing composition can be reduced, for example, by heat drying the optical device surface-sealing composition under vacuum.

The water content of the optical device surface-sealing composition of the present invention may be obtained by, for example, weighing about 0.1 g of sample piece of the sheet, heating the sample piece to 150° C. with a Karl Fischer moisture meter, and measuring the water content generated on the occasion (sublimation method).

The thickness of the layer formed of the optical device surface-sealing composition of the present invention is, for example, 1 to 100 preferably 10 to 30 µm, more preferably 20 to 30 µm, depending on the type of material to be sealed.

Preferably the layer formed of the optical device surface-sealing composition of the present invention has proper flowability at the temperature for surface-sealing an optical device such as an organic EL device. The reason for this is that when sealing the optical device such as an organic EL device, irregularities on the device surface are smoothed out by the sheet which has been thermally made flowable so as to fill the recesses of the irregularities. The flowability during thermocompression may be determined from the melting point. The melting point is a temperature at which flowability is exhibited when the layer formed of the optical device surface-sealing composition is heated, which is preferably 30 to 100° C. In the case that the optical device surface-sealing composition of the present invention contains the solvent (E), the melting point is for the dried material after drying the composition for substantially removing the solvent (E).

The melting point is obtained by finding the setting temperature for initiation of melting of the sheet (thickness: 100 µm) pressed against a glass plate on a hot plate. With a melting point lower than 30° C., the layer formed of the optical device surface-sealing composition easily causes sagging due to the excessively large flowability in thermal transferring (thermocompression) or when sealing by heat curing, resulting in difficulty in control of the film thickness of the cured product. In contrast, with a melting point higher than 100° C., a gap is likely to be easily formed between the layer formed of the optical device surface-sealing composition and an optical device such as an organic EL device due to worsened workability during thermal transferring, and adversely affects the optical device such as an organic EL device due to heating.

The layer formed of the optical device surface-sealing composition of the present invention has proper flowability when laminated with an optical device such as an organic EL device for thermocompression. Consequently formation of a gap between the layer formed of the optical device surface-sealing composition of the present invention and an optical device such as an organic EL device is limited, resulting in excellent adhesion.

As described above, the sealing sheet of the present invention may include a layer formed of the optical device surface-sealing composition of the present invention, a substrate film, and a protective film. Examples of the substrate film and the protective film include known mold-releasing films, preferably films having moisture barrier properties or gas barrier properties, more preferably polyethylene terephthalate films. The thickness of the substrate film or the protective film is, for example, about 50 µm in view of having compatibility with a material to be sealed such as an organic EL device, depending on a film material.

The sealing sheet of the present invention may further have a gas barrier layer on an as-needed basis. The gas barrier layer may limit permeation of moisture and gas such as moisture in ambient air which degrades the optical device such as an organic EL device in the display. The gas barrier layer may be disposed at any location other than the surface in contact with an optical device such as an organic EL device, preferably disposed between the substrate film and the layer formed of the optical device surface-sealing composition of the present invention.

The material for constituting the gas barrier layer is not specifically limited, and examples include Al, Cr, Ni, Cu, Zn, Si, Fe, Ti, Ag, Au, and Co; oxides of these metals; nitrides of these metals; and oxynitrides of these metals. These materials may be used singly or in combination. The gas barrier layer of a sealing sheet used when sealing a bottom emission organic EL device is preferably formed of a material having high light reflectivity such as Al and Cu. The gas barrier layer of a sealing sheet used when sealing a top emission organic EL device is preferably formed of a material having high light transmission such as polyethylene terephthalate (PET), polycarbonate (PC), and cyclic polyolefin (COP). The thickness of the gas barrier layer may be about 100 µm to about 3,000 µm.

The sealing sheet having a gas barrier layer may be manufactured by forming a gas barrier layer on a substrate film and then forming the layer of the optical device surface-sealing composition of the present invention. The forming method of the gas barrier layer is not specifically limited, including as dry process various PVD methods such as vacuum deposition, sputtering, and ion plating and CVD methods such as plasma CVD, and as wet process plating and coating.

Preferably a protective film is further laminated on the layer formed of the optical device surface-sealing composition. Preferably the lamination is performed at about 60° C., using, for example, a laminator. The thickness of the protective film is, for example, about 20 µm.

FIG. 1 illustrates a preferred example of the sealing sheet. As shown in FIG. 1 sealing sheet 10 includes substrate film 12, layer 16 formed of the optical device surface-sealing composition formed on substrate film 12, and protective film 18 disposed on layer 16 formed of the optical device surface-sealing composition.

Sealing sheet 10 may be used, for example, as an organic EL device surface-sealing sheet by peeling protective film 18 and then disposing exposed layer 16 formed of the optical device surface-sealing composition in contact with a display substrate on which an organic EL device is disposed.

Preferably the sealing sheet of the present invention is stored together with a drying agent such as silica gel, so that the water content is maintained at a certain level or less.

3. Application of Optical Device Surface-Sealing Composition

The optical device surface-sealing composition and sealing sheet of the present invention are cured for use as a surface-sealing material, in the case of the optical device surface-sealing composition having thermosetting properties. In contrast, in the case of the optical device surface-sealing composition having no thermosetting properties, the composition itself may be used as a surface-sealing material. The object to be sealed (also referred to as a material to be sealed) is not specifically limited, preferably including, for example, an optical device. Examples of the optical device include an organic EL device, a liquid crystal, and an LED, preferably an organic EL device.

Preferably the optical device surface-sealing composition and sealing sheet of the present invention are used as a surface-sealing material for a display using an optical device (organic EL display, in particular), i.e. as an organic EL device surface-sealing composition or an organic EL device surface-sealing sheet. In view of the coupling-out efficiency of a top emission organic EL display, transparency is required for the surface-sealing material. Since an organic EL device is easily deteriorated by moisture, low moisture permeability in particular is required for the surface-sealing material.

The cured product of the optical device surface-sealing composition of the present invention has a moisture permeability of preferably 60 (g/m$^2$·24 h) or less, more preferably 30 (g/m$^2$·24 h) or less. The moisture permeability is obtained by measuring a 100-µm cured product of the optical device surface-sealing composition under conditions of 60° C./90% RH according to JIS Z0208.

The adhesion force between the cured product of the optical device surface-sealing composition of the present invention and a material to be sealed is preferably 100 gf/15 mm or more.

The adhesion force between the cured product and the material to be sealed is measured by the following method. On the aluminum foil-side of a lamination film of an aluminum foil and PET (product name: AL-PET), the optical device surface-sealing composition is applied and dried to form a thickness of about 15 µm. The surface of the optical device surface-sealing composition is thermocompressed onto a glass substrate (glass plate according to JIS R3202, 100 mm by 25 mm by 2 mm) with a roll laminator (MRK-650Y type, made by MCK Co., Ltd.) under conditions with a velocity of 0.3 m/min, an air cylinder pressure of 0.2 MPa, a roller temperature of 90° C., and top and bottom heating. The laminate is heated at 80° C. for 30 minutes in an oven, so that the optical device surface-sealing composition is cured. The laminate is then cut into a width of 15 mm, and the 90-degree peeling strength of the bond between the glass substrate and the optical device surface-sealing composition is measured with a peeling testing machine (apparatus name: STOROGRAPH E-S, range: 50 mm/min). The 90-degree peeling strength is regarded as the adhesion force in the present invention.

Preferably the cured product of the optical device surface-sealing composition of the present invention has a Tg of 40° C. or higher in view of maintaining the adhesion force. An excessively low Tg allows the adhesion force with a substrate to be reduced, which may decrease the water vapor barrier properties. Tg of the cured product is obtained from the inflexion point in measurement of the linear expansion coefficient with a TMA (TMA/SS6000 made by Seiko Instruments Inc.) under conditions with a rate of temperature increase of 5° C./min.

The optical device surface-sealing composition of the present invention has a solvent content of preferably 50,000 ppm by mass or less, more preferably 30,000 ppm by mass or less relative to the total composition components. A large content of the solvent in the optical device surface-sealing composition may have an effect on a material to be sealed. The amount of the solvent in the optical device surface-sealing composition may be measured with, for example, an IR absorption spectrometer (FT/IR-4100 made by JASCO Corporation). The method for measuring the amount of solvent will be described below for the composition containing methyl ethyl ketone (MEK) as a solvent.

A reference sample (optical device surface-sealing composition) the amount of the solvent of which is quantitatively determined by gas chromatography/mass spectrometry (GC-MS) in advance is prepared. The IR absorption spectrum of the reference sample is measured. The intensity ratio of the absorption peak of C=O of MEK (about 1,710 cm$^{-1}$) to the absorption peak of C=C of epoxy resin (about 1,609 cm$^{-1}$) is calculated from the IR absorption spectrum of the reference sample. Subsequently, the IR absorption spectrum of the measurement sample (optical device surface-sealing composition) is measured, and the intensity ratio of the absorption peak of C=O of MEK (about 1,710 cm$^{-1}$) to the absorption peak of C=C of epoxy resin (about 1,609 cm$^{-1}$) is calculated. The proportion of the peak intensity ratio of the measurement sample relative to the peak intensity ratio of the reference sample is obtained, so that the amount of solvent contained in the measurement sample is calculated.

4. Display

A display includes: a substrate on which an optical device such as an organic EL device is disposed (display substrate); a counter substrate to make a pair with the display substrate; and a surface-sealing material which is disposed between the display substrate and the counter substrate for sealing the optical device such as an organic EL device. As described above, a display that includes a surface-sealing material filling a part of space formed between the optical device such as an organic EL device and a sealing substrate is called a surface-sealing type display By way of example, use of the optical device surface-sealing composition of the present invention for sealing an organic EL device in an organic EL display will be described below. However, the display of the present invention is not limited to an organic EL display. Use of the optical device surface-sealing composition of the present invention for sealing an organic EL device in a top emission structure is also described, but the display of the present invention is not limited to a top emission structure. Examples of the display in the present invention include not only an output apparatus of a computer or the like but also an illumination apparatus such as a lighting apparatus.

Figure 2:
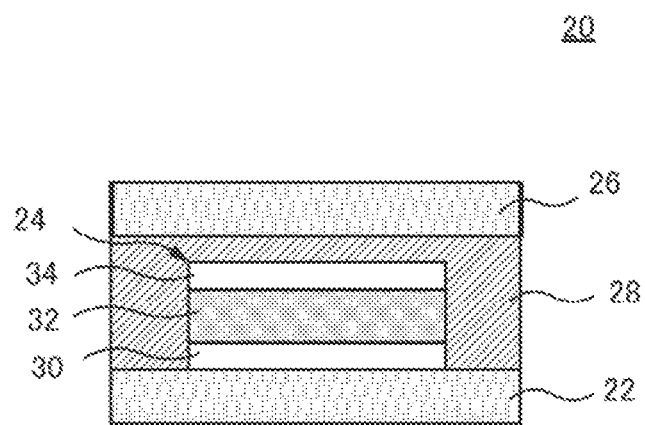
FIG. 2 is a cross-sectional diagram illustrating an organic EL display according to an embodiment of the present invention.

FIG. 2 is a schematic cross-sectional diagram, illustrating a surface-sealing type organic EL display having a top emission structure. As shown in FIG. 2, organic EL display 20 includes display substrate 22, organic EL device 24, counter substrate (transparent substrate) 26, which are laminated in the order presented. Surface-sealing material 28 is filled between the periphery of organic EL device 24 and counter substrate (transparent substrate) 26. In the organic EL display of the present invention, surface-sealing material 28 in FIG. 2 can be the cured product or thermocompressed material of the optical device surface-sealing composition of the present invention.

Organic EL device 24 includes cathode reflecting electrode layer 30 (formed of aluminum, silver, or the like), organic EL layer 32, and anode transparent electrode layer 34 (formed of ITO, IZO, or the like), which are laminated in the order presented from the display substrate 22 side. Cathode reflecting electrode layer 30, organic EL layer 32, and anode transparent electrode layer 34 may be formed as a film by vacuum vapor deposition, sputtering, or the like.

The substrate for use in an organic EL display is described in the following. A substrate (H) and a substrate (L) to be described later may be the display substrate and the counter substrate, respectively. Both of the substrates are used as the substrates of the organic EL display of the present invention. More specifically, a combination of the substrate (H) as display substrate and the substrate (L) as counter substrate, or a combination of the substrate (H) as counter substrate and the substrate (L) as display substrate constitutes the organic EL display of the present invention.

Substrate (H)

The substrate (H) is a member with a surface on which an organic EL device may be disposed. The substrate (H) may be transparent or non-transparent. In the case that light is extracted from an organic light-emitting layer through the substrate (H), the substrate (H) is transparent.

The substrate (H) has a linear expansion coefficient larger than that of the substrate (L). More specifically the coefficient may be larger than the linear expansion coefficient of the substrate (L) by $5 \times 10^{-6}$ cm/cm/° C. or more.

The linear expansion coefficient of the substrate (H) may be $20 \times 10^{-6}$ cm/cm/° C. to $200 \times 10^{-6}$ cm/cm/° C., preferably $20 \times 10^{-6}$ cm/cm/° C. to $180 \times 10^{-6}$ cm/cm/° C. The linear expansion coefficient of the substrate (H) may be measured, for example, by TMA method, based on ASTM E-831. The linear expansion coefficient of the substrate (H) is the average of linear expansion coefficients in the range of 25 to 100° C.

The thickness of the substrate (H) is preferably 5 to 300 μm. The modulus of elongation of the substrate (H) is preferably 10 to 500 MPa.

The material of the substrate (H) is not specifically limited, preferably is a metal including aluminum (preferably aluminum) or a resin. Examples of the preferred resin include one or more polymers selected from the group consisting of an ester (co)polymer, a cyclic olefin (co)polymer, a 4-methyl-1-pentene (co)polymer, an acrylic (co)polymer, and polycarbonate.

A "(co)polymer" as used herein encompasses both homopolymer and copolymer. More specifically, 4-methyl-1-pentene (co)polymer encompasses poly4-methyl-1-pentene, a homopolymer of 4-methyl-1-pentene, and a copolymer of 4-methyl-1-pentene and a compound copolymerizable with 4-methyl-1-pentene, such as an α-olefin. A cyclic olefin (co)polymer encompasses both a polymer (homopolymer) of a cyclic olefin and a copolymer of a cyclic olefin and a polymerizable compound copolymerizable with the cyclic olefin.

In order to improve the water vapor barrier properties and the adhesion force of the substrate (H), a film formed of an inorganic material such as $SiO_2$ may be laminated on the substrate (H).

Substrate (L)

In an organic EL display, the substrate (L) is laminated on the surface-sealing material. The substrate (L) has a linear expansion coefficient lower than that of the substrate (H). More specifically the coefficient may be lower than the linear expansion coefficient of the substrate (H) by $5 \times 10^{-6}$ cm/cm/° C. or more. The linear expansion coefficient of the substrate (L) may be preferably in the range of $1 \times 10^{-6}$ cm/cm/° C. to $100 \times 10^{-6}$ cm/cm/° C., more preferably in the range of $5 \times 10^{-6}$ cm/cm/° C. to $10 \times 10^{-6}$ cm/cm/° C.

The material of the substrate (L) is not specifically limited, including inorganic materials such as glass and silicon and resins such as an ester copolymer (PET, PEN, PBT, or the like), polyimide, polycarbonate, and polyamide. The inorganic material such as glass and silicon is preferred.

The thickness of the substrate (L) is preferably 0.1 to 1 mm, in view of thinning and durability of an organic EL display.

5. Method of Manufacturing Display

A display having a surface-sealing material formed of the cured product of the optical device surface-sealing composition of the present invention (also referred to as an organic EL device surface-sealing composition for use in an organic EL device) or formed of the composition itself may be manufactured by any method. The display having an optical device may be manufactured by a method including at least step 1) of obtaining a laminate having a substrate on which an optical device such as an organic EL device is disposed, a layer formed of the optical device surface-sealing composition of the present invention which is laminated on the optical device, and another substrate in the order presented, and step 2) of heating the laminate at, for example, 50 to 110° C.

In the manufacturing method of the display of the present invention, the form of the optical device surface-sealing composition of the present invention is not specifically limited, which may be in a liquid form or in a sheet form. The optical device surface-sealing composition of the present invention may or may not have thermosetting properties.

The method for manufacturing an organic EL display using the optical device surface-sealing composition of the present invention having thermosetting properties will be described in the following.

More specifically, the manufacturing method includes: step 1) of obtaining a laminate of display substrate 22 on which organic EL device 24 as an optical device is disposed, an optical device surface-sealing composition of the present invention, and counter substrate (transparent substrate) 26; step 2A) of thermocompressing the optical device surface-sealing composition in a sheet form of the obtained laminate; and step 2B) of curing the thermocompressed optical device surface-sealing composition in a sheet form. Step 2A) and step 2B) may be performed in one step at a time on an as-needed basis. Each of the steps is performed according to a known method.

In step 1), a laminate may be obtained by placing (or transferring) the sheet-like optical device surface-sealing composition on display substrate 22 on which organic EL device 24 is disposed and then laminating counter substrate (transparent substrate) 26 to make a pair on the composition (method (i)).

On this occasion, in the case of the sealing sheet of the present invention having a protective film, the protective film may be peeled to expose the layer formed of the optical device surface-sealing composition, which is then placed on organic EL device 24 to peel the substrate film for transfer. Alternatively, the sheet-like optical device surface-sealing composition having no protective film may be directly placed on organic EL device 24 with a roll laminator or the like.

Alternatively, counter substrate 26 on which a layer formed of the optical device surface-sealing composition of the present invention is disposed in advance may be prepared, which is then laminated on display substrate 22 on which organic EL device 24 is formed so as to form a laminate (method (ii)). This method is effective, for example, when the optical device surface-sealing composition is directly incorporated in an organic EL display without peeling of the substrate film.

In step 2A), the sheet-like optical device surface-sealing composition is thermocompressed, for example, at 50 to 110° C. with a vacuum laminator apparatus, so that thermocompression of the sheet-like optical device surface-sealing composition and organic EL device 24 and thermocompression of the sheet-like optical device surface-sealing composition and display substrate 22 or counter substrate 26 are performed. On this occasion, preferably the organic EL device-side is heated to 50 to 110° C. in advance for lamination of organic EL device 24 and the optical device surface-sealing composition.

In step 2B), the sheet-like optical device surface-sealing composition is thoroughly cured, for example, at 80 to 100° C. in many cases. Preferably the heat curing is performed at 80 to 100° C. for 0.1 to 2 hours. The temperature for heat curing is set at 110° C. or lower, so that no damage is imparted to organic EL device 24.

Limitation of Warpage of Display of Present Invention

Even though the display of the present invention has a large difference in linear expansion coefficient between the substrate (H) and the substrate (L), the warpage of the display to be caused by formation of the surface-sealing material by heat curing of a surface-sealing composition having thermosetting properties or by thermocompressing a surface-sealing composition having no thermosetting properties can be limited.

Figure 3A:
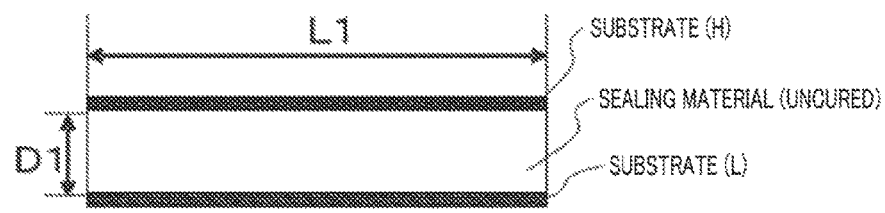
FIG. 3A illustrates a laminate before heat curing during the manufacturing process of an organic EL display.
Figure 3B:
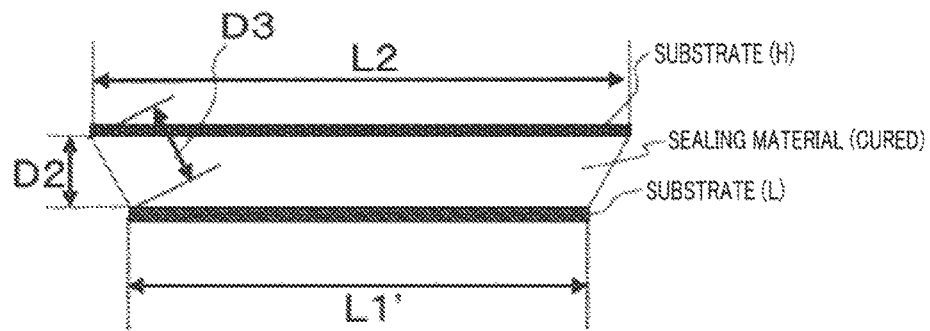
FIG. 3B illustrates the state of a heat-cured layer formed of a surface-sealing composition by heating the laminate in FIG. 3A.
Figure 3C:
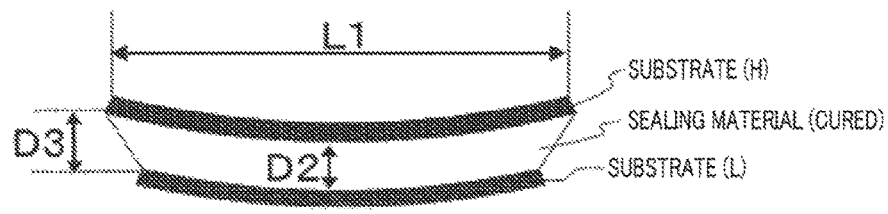
FIG. 3C illustrates the cooled state of a conventional laminate heated in FIG. 3B.

The mechanism by which warpage is limited will now be described with reference to FIGS. 3A to 3C. FIG. 3A illustrates a laminate having a substrate (H), a layer 302 formed of a surface-sealing composition having thermosetting properties, and a substrate (L) before heat curing in the manufacturing process of a display. In FIGS. 3A to 3C, an optical device such as an organic EL device is omitted.

FIG. 3A illustrates a laminate having a substrate (H), a layer 302 formed of a surface-sealing composition, and a substrate (L) as described above. The thickness of the layer 302 formed of a surface-sealing composition is represented by D1. The width of the laminate is represented by L1.

FIG. 3B illustrates the state of cured layer 302 formed of a surface-sealing composition by heating the laminate shown in FIG. 3A. Since the substrate (H) has a large expansion coefficient, the substrate (H) expands to have a width of L2 during heating. On the other hand, since the substrate (L) has a low expansion coefficient, the substrate (L) hardly expands during heating, so that the width L1' is not much changed from L1. The thickness of cured product 306 of the surface-sealing composition becomes D2 (D2<D1), and the length of the side of cured product 306 of the surface-sealing composition becomes D3 (D1<D3).

FIG. 3C illustrates the cooled state of a conventional laminate heated in FIG. 3B. Since the cured product 306 of a conventional surface-sealing composition usually has a high storage elastic modulus at the temperature for surface-sealing, it attempts to maintain its shape. Consequently a recess is formed in the center part of the substrate (H), so that warpage occurs in the laminate. Warpage thus occurred in a conventional display, particularly in an organic EL display, in some cases.

In the present invention, an optical device surface-sealing composition having a storage elastic modulus G' (80) of $1.0 \times 10^3$ to $2.0 \times 10^6$ Pa at 80° C. measured after temperature increase from 40° C. to 80° C. at 5° C./min and subsequent temperature retention at 80° C. for 30 minutes is used. The cured product of the surface-sealing composition of the present invention thus has a reduced storage elastic modulus at the temperature for surface-sealing. In other words, a certain degree of flexibility can be imparted to the cured product of the composition (surface-sealing material) at the temperature for surface-sealing an organic EL device, so that the stress caused between the substrate (H) having a large linear expansion coefficient and the substrate (L) having a small liner expansion coefficient can be appropriately relaxed. The display to be obtained thus can prevent from being warped due to the mechanism described above.

EXAMPLES

The present invention is further described with reference to Examples and Comparative Examples, which however shall not be construed as limiting the scope of the present invention.

1. Material of Surface-Sealing Composition

Firstly, the components used in Examples and Comparative Examples are described. The weight-average molecular weight of the component (A) is a measured value measured by the method described above. Although a sheet-like optical device surface-sealing composition is used in Examples, the composition of the present invention may be in a liquid form, not limited to a sheet form.

The storage elastic modulus GE (80) of the raw material epoxy resin is the storage elastic modulus G'E (80) of a cured product made by the following method measured by the method described in (3) Storage elastic modulus to be described later.

(Method for Measuring the Storage Elastic Modulus G'E (80))

1) As raw materials, 70 parts by weight of epoxy resin, 30 parts by weight of acid anhydride (e.g. RIKACID MH700G (main component: methylhexahydrophthalic anhydride, made by New Japan Chemical Co., Ltd.)), 1 part by weight of a curing accelerator (e.g. IBMI12 (1-isobutyl-2-methyl-imidazole, made by Mitsubishi Chemical Corporation)), and 1 part by weight of a curing accelerator (e.g. 2E4MZ (1-cyanoethyl-2-ethyl-4-methylimidazole), made by Shikoku Chemicals Corporation) were mixed to prepare a varnish.

2) Meanwhile, a laminate of a glass plate/a mold-releasing film/a spacer (500-μm thick)/a mold-releasing film/a glass plate spacer was made. The center part of the laminate was hollowed out so as to form a 1.5 cm by 1.5 cm square recess for use as a curing instrument.

3) The recess of the obtained instrument was filled with the varnish prepared in the 1) and the thickness of the varnish was adjusted to 500 μm by the own weight of the glass plate. The instrument filled with the varnish was heated at 80° C. for 1 hour to 3 hours until stickiness to the mold-releasing film disappeared, so that the varnish was cured.

4) The storage elastic modulus G'E (80) at 80° C. of the produced cured product of flexible epoxy resin composition was measured by the "(3) storage elastic modulus method" to be described later.

(A) Flexible Epoxy Resin

EG-250 (made by Osaka Gas Chemicals Co., Ltd.): epoxy equivalent of 417 g/eq, viscosity of 36,500 mPa·s, storage elastic modulus G'E (80) of $3.4 \times 10^5$ Pa, fluorene skeleton-containing epoxy resin;

EG-280 (made by Osaka Gas Chemicals Co., Ltd.): epoxy equivalent of 467 g/eq, viscosity of 7,440 mPa·s, storage elastic modulus G'E (80) of $1.2 \times 10^5$ Pa, fluorene skeleton-containing epoxy resin;

BPO-20E (made by New Japan Chemical Co., Ltd.): bisphenol A bis(triethylene glycol glycidyl ether)ether, molecular weight of 457, epoxy equivalent of 310 to 340 g/eq, viscosity of 3,500 to 5,500 mPa·s, storage elastic modulus G'E (80) of $2.8 \times 10^4$ Pa.

[Chemical structure formula]

In the formula, $n_{d1}$ and $n_{d2}$ each represent an integer of 0 or more, with a total of 2.

BPO-60E (made by New Japan Chemical Co., Ltd.): bisphenol A bis(propylene glycol glycidyl ether)ether, molecular weight of 541, epoxy equivalent of 345 to 385 g/eq, viscosity of 800 to 1,600 mPa·s, storage elastic modulus G'E (80) of $5.4 \times 10^4$ Pa.

[Chemical structure formula]

In the formula, $n_{d3}$ and $n_{d4}$ each represent an integer of 0 or more, with a total of 6.

(B) Curing Accelerator

IBMI12 (1-isobutyl-2-methylimidazole) (made by Mitsubishi Chemical Corporation)

(C) High Molecular Weight Epoxy Resin

<Bisphenol F Type Epoxy Resin> jER4010 (made by Mitsubishi Chemical Corporation): weight-average molecular weight of 39,102, epoxy equivalent of 4,400 g/eq.

jER4005 (made by Mitsubishi Chemical Corporation): weight-average molecular weight of 7,582, epoxy equivalent of 1,070 g/eq.

jER4007 (made by Mitsubishi Chemical Corporation): epoxy equivalent of 2,270 g/eq.

(D) Low Molecular Weight Epoxy Resin

<Bisphenol F Type Epoxy Resin>

YL983U (made by Mitsubishi Chemical Corporation): weight-average molecular weight of 398, epoxy equivalent of 170 g/eq, storage elastic modulus GE (80) of $2.2 \times 10^6$ Pa.

jER807 (made by Mitsubishi Chemical Corporation): weight-average molecular weight of 229, epoxy equivalent of 175 g/eq, storage elastic modulus G'E (80) of $2.1 \times 10^6$ Pa.

(E) Silane Coupling Agent

KBM-403 (3-glycidoxypropyltrimethoxysilane, molecular weight of 236) (made by Shin-Etsu Chemical Co., Ltd.)

(F) Solvent

Methyl Ethyl Ketone

Example 1

Into a flask, 0.3 parts by mass of EG-280 as flexible epoxy resin (A), 0.6 parts by mass of jER4010 as high molecular weight epoxy resin (C), and 0.1 parts by mass of jER807 as low molecular weight epoxy resin (D) were fed, to which 0.67 parts by mass of methyl ethyl ketone as solvent (F) was added and stirred for dissolution at room temperature. To the solution, 0.06 parts by mass of IBMI12 as curing accelerator (B) and 0.001 parts by mass of KBM-403 as silane coupling agent (E) were added and stirred at room temperature to prepare a varnish of epoxy resin composition.

The prepared varnish was applied to a mold release treated PET film (PUREX A53, 38 μm, made by Teijin DuPont Films Japan Ltd.) with a coater so as to have a dried thickness of about 20 μm, which was dried under vacuum at 40° C. for 2 hours. An optical device surface-sealing composition which is solid at room temperature (about 25° C.) was thus obtained. The composition had an amount of the remaining solvent of 212 ppm. Further, a mold-releasing treated PET film (PUREX A31, made by Teijin DuPont Films Japan Ltd.) as a protective film was thermocompressed on the optical device surface-sealing composition, so that an optical device surface-sealing sheet was obtained. The protective film is properly peeled to expose the surface of the optical device surface-sealing composition for use.

Examples 2 to 7 and Comparative Examples 1 and 2

Except that the composition ratio (mass ratio) was changed as shown in Table 1, the varnish of epoxy resin composition was prepared in the same way as in Example 1 so as to prepare an optical device surface-sealing sheet.

Example 8

A thermoplastic elastomer (TAFMER A4085, made by Mitsui Chemicals, Inc.) was melted at 220° C. and extrusion molded from a T-die so as to form into a sheet with a thickness of 400 μm. A sheet-like optical device surface-sealing composition (thickness: 40 μm) in Comparative Example 1 was thermocompressed to both surfaces of the obtained sheet at 65° C. so as to form into a laminated sheet of optical device surface-sealing composition (total thickness: 480 μm). The storage elastic modulus G' (80) of the obtained laminated sheet was $1.0 \times 10^5$ Pa·s, measured by the method to be described later in (3) Storage elastic modulus. The amount of warpage was evaluated to be 1.6 mm, by the method to be described later in (4) Warpage evaluation method.

For the optical device surface-sealing compositions obtained in Examples 1 to 7 and Comparative Examples 1 and 2, the amount of remaining MEK, melting point, Tg of the cured product, storage elastic modulus of the cured product, and warpage of a panel were evaluated by the following method. The results are shown in Table 1.

(1) Melting Point

The varnish was applied to a substrate film (trade name: A53, thickness: 38 made by Teijin DuPont Films Japan Ltd.) with an applicator so as to have a dried thickness of about 15 μm. The produced film was kept in an inert oven (30° C.) for 10 minutes, and then in a vacuum oven (40° C.) for 2 hours, so that MEK in the applied varnish film was removed by drying. A sealing sheet having a layer formed of optical device surface-sealing composition was thus obtained.

A strip specimen with a length of about 40 mm and a width of about 5 mm was cut out from the dried sealing sheet. The layer formed of the optical device surface-sealing composition of the strip specimen is disposed to come in contact with a heated glass plate on a hot plate. The strip specimen was gripped at one end in the length direction so as to be gradually peeled from the surface of the glass plate in the 180° direction for the evaluation of adhesion peelability. The operation was initiated at a setting temperature of the hot plate of 35° C. and performed up to 70° C. (temperature at which the melting point can be confirmed) with a temperature increment of 1° C. Every time the setting temperature is increased by 1° C., a new strip specimen was used. The temperature at which the adhesion peelability of the optical device surface-sealing composition layer reached the highest during peeling was defined as the melting point.

(2) Tg

A cut out optical device surface-sealing composition in a sheet form (thickness: 12 μm) having a predetermined size was sandwiched with two glass plates and then bonded by heat curing at 100° C. for 30 minutes. Subsequently the glass plates were peeled, so that the sheet-like cured product of the optical device surface-sealing composition was taken out. The linear expansion coefficient of the cured product was measured with a TMA (TMA/SS6000 made by Seiko Instruments Inc.) under conditions with a rate of temperature increase of 5° C./min. The Tg was obtained from the inflexion point thereof.

(3) Storage Elastic Modulus

A plurality sheets of optical device surface-sealing composition were laminated on a PET film disposed on a hot plate set at 60° C., and then thermocompressed to form into a sheet-like optical device surface-sealing composition having a film thickness of 300 to 500 μm. The obtained sheet-like optical device surface-sealing composition was measured with a rheometer made by Haake, Inc. (RS150 type) at a measurement frequency of 1 Hz, at a temperature increase rate of 5° C./min, in a measurement temperature range of 40 to 80° C., so that the storage elastic modulus G' (80) at 80° C. was obtained.

(4) Warpage of Laminate

A glass substrate (cover glass made by Matsunami, 50×70 mm, thickness No. 1 (150 μm)) was used as the substrate (L). MELINEX S (PET made by Teijin DuPont Films Japan Ltd., 100 μm) was used as the substrate (H). The glass substrate, i.e. substrate (L), had a linear expansion coefficient of $8.5 \times 10^{-6}$ cm/cm/° C.

A laminate of the substrate (L) (glass substrate, thickness: 150 μm)/a layer formed of an optical device surface-sealing composition (thickness: 40 μm)/the substrate (H) (trade name: MELINEX S, made by Teijin DuPont Films Japan Ltd., thickness: 100 μm), which are laminated in the order presented, was obtained.

After measurement of the thickness T1 of the obtained laminate, the laminate was heated at 80° C. for 3 hours, so that the optical device surface-sealing composition was thermally cured. Subsequently the laminate was cooled to 25° C., and placed on a horizontal plate. One of the sides of the glass with a width of 50 mm was fixed to the horizontal plate with a tape, and each of the distance between the two corners of the other side of the glass with a width of 50 mm and the upper face of the plate was measured to obtain the average T2. The amount of warpage T3 was then calculated by subtracting T1 from T2.

TABLE 1

| Varnish Composition | | | Example 1 | Example 2 | Example 3 | Example 4 | Example 5 | Example 6 | Example 7 | Comparative Example 1 | Comparative Example 2 |
|---|---|---|---|---|---|---|---|---|---|---|---|
| | (A) Flexible epoxy resin | EG-250 | | | | | | | | | |
| | | EG-280 | 0.3 | | | | | | | | |
| | | BPO-20E | | 0.3 | | | | | | | |
| | | BPO-60E | | | 0.3 | 0.3 | 0.3 | 0.3 | 0.3 | | |
| | (C) High molecular weight epoxy resin | jER-4010 | 0.6 | 0.6 | 0.6 | 0.6 | | 0.6 | 0.6 | | 0.6 |
| | | jER-4005 | | | | | | | | 0.8 | |
| | | jER-4007 | | | | | 0.6 | | | | |
| | (D) Low molecular weight epoxy resin | jER-807 | 0.1 | 0.1 | 0.1 | | | | | | 0.4 |
| | | YL-983U | | | | 0.1 | 0.1 | 0.1 | 0.1 | 0.2 | |
| | (B) airing agent | IBMI12 | 0.06 | 0.06 | 0.06 | 0.06 | 0.06 | 0.03 | 0.03 | 0.06 | 0.06 |
| | (E) Silane coupling agent | KBM-403 | 0.001 | 0.001 | 0.001 | 0.001 | 0.001 | 0.001 | 0.04 | 0.001 | 0.001 |
| | (F) Solvent | MEK | 0.67 | 0.67 | 0.67 | 0.67 | 0.67 | 0.67 | 0.67 | 0.67 | 0.67 |

TABLE 1-continued

|  |  | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Evaluation | Amount of remaining MEK in sheet-like composition (ppm) | 212 |  | 0 | 91 | 42 | 11 |  |  | 6289 |
|  | (1) Melting point of sheet-like composition (° C.) | 51 |  | 45 | 43 | 42 | 45 | 46 |  | 40 |
|  | (2) Physical property Tg of cured product (° C.) | 54 |  | 53 |  |  |  |  |  | 78 |
|  | (3) Storage elastic modulus G' (80) of cured product (×10⁵ Pa) | 4 | 8 | 8 | 5 | 6 | 6 | 1 | 75 | 64 |
|  | (4) Warpage evaluation (amount of warpage T3(mm)) | 3.8 | 2.4 | 3.7 | 4.3 | 2.5 | 1.6 | 2.7 | 9 | 5.9 |

As shown in Table 1, the surface-sealing composition in each of Examples 1 to 7 has less warpage in the obtained laminate, since the cured product has a storage elastic modulus G' (80) of a certain value or lower. On the other hand, it is shown that the surface-sealing composition in each of Comparative Examples 1 and 2 has large warpage in the obtained laminate, since the cured product has an excessively high storage elastic modulus G' (80).

The present application claims the priority based on Japanese Patent Application No. 2012-038838 filed on Feb. 24, 2012, the entire content described in the specification and drawings of which is incorporated herein by reference.

INDUSTRIAL APPLICABILITY

Since the display of the present invention has a limited amount of warpage, damages to optical devices such as organic EL devices is reduced, allowing for further thinning of a display.

REFERENCE SIGNS LIST

10 Organic EL device surface-sealing sheet
12 Substrate film
16 Layer formed of optical device surface-sealing composition
18 Protective film
20 Organic EL display
22 Display substrate
24 Organic EL device
26 Counter substrate (transparent substrate)
28 Surface-sealing material
30 Cathode reflecting electrode layer
32 Organic EL layer
34 Anode transparent electrode layer

The invention claimed is:

1. An optical device surface-sealing composition comprising a flexible epoxy resin (A) having two or more epoxy groups in a molecule and having a hard segment including a fluorene structure or a bisphenol structure, and a soft segment including a structure derived from a compound selected from the group consisting of $C_{2\text{-}20}$ alkylene glycol, polybutadiene, and a butadiene-acrylic copolymer,
a curing accelerator (B),
a high molecular weight epoxy resin (C) having a repeating structural unit represented by the following formula (1) and having a weight-average molecular weight of $2 \times 10^3$ to $1 \times 10^5$,

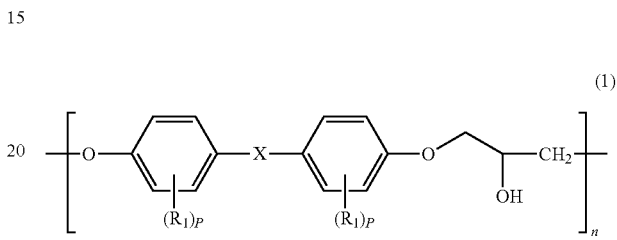

wherein:
X represents a single bond, a methylene group, an isopropylidene group, —S—, or —$SO_2$—,
$R_1$ each independently represents a $C_{1\text{-}5}$ alkyl group,
P each independently represents a substitution number of a substituent $R_1$, the substitution number being an integer of 0 to 4,
n represents an integer of 2 or more), and
a low molecular weight epoxy resin (D) represented by the formula (2), and having a weight-average molecular weight of 100 to 1,200,

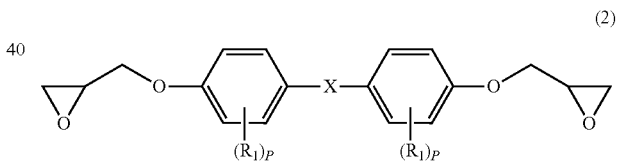

wherein, X, $R_1$, and P are the same as X, $R_1$, and P in the formula (1),
wherein:
the content of the high molecular weight epoxy resin (C) is 100 to 1,200 parts by mass relative to the total 100 parts by mass of the flexible epoxy resin (A) and the low molecular weight epoxy resin (D), and
the composition has a storage elastic modulus G' (80) of $1.0 \times 10^3$ to $2.0 \times 10^6$ Pa at 80° C. as measured after a temperature increase from 40° C. to 80° C. at 5° C./min and a subsequent temperature retention at 80° C. for 30 minutes.

2. The optical device surface-sealing composition according to claim 1, wherein 10 to 70 parts by mass of the component (A) is contained relative to 100 parts by mass of the entire composition.

3. The optical device surface-sealing composition according to claim 1, optionally comprising a silane coupling agent (E), wherein
the content of the low molecular weight epoxy resin (D) is 1 to 100 parts by mass relative to the total 100 parts by mass of the high molecular weight epoxy resin (C), the curing accelerator (B), and the silane coupling agent (E).

4. The optical device surface-sealing composition according to claim 1, wherein the composition is used for surface-sealing an organic EL device.

5. The optical device surface-sealing composition according to claim 1, wherein the composition is in a sheet form.

* * * * *